US008445362B2

(12) United States Patent  
Moy et al.

(10) Patent No.: US 8,445,362 B2
(45) Date of Patent: May 21, 2013

(54) APPARATUS AND METHOD FOR PROGRAMMING AN ELECTRONICALLY PROGRAMMABLE SEMICONDUCTOR FUSE

(75) Inventors: Dan Moy, Bethel, CT (US); Stephen Wu, Poughkeepsie, NY (US); Peter Wang, Wappingers Falls, NY (US); Brian W. Messenger, Newburgh, NY (US); Edwin Soler, Wallkill, NY (US); Gabriel Chiulli, Middlebury, CT (US)

(73) Assignee: International Business Machines Corporation, Armonk, NY (US)

( * ) Notice: Subject to any disclaimer, the term of this patent is extended or adjusted under 35 U.S.C. 154(b) by 316 days.

(21) Appl. No.: 11/548,482

(22) Filed: Oct. 11, 2006

(65) Prior Publication Data

US 2008/0089159 A1  Apr. 17, 2008

(51) Int. Cl.
*H01L 21/326* (2006.01)
*H01L 21/479* (2006.01)
(52) U.S. Cl.
USPC .......... 438/468; 438/467; 438/469; 438/132; 257/E21.592
(58) Field of Classification Search
USPC .................. 257/529, E21.592; 438/132, 467, 438/468, 469
See application file for complete search history.

(56) References Cited

U.S. PATENT DOCUMENTS

| | | | | |
|---|---|---|---|---|
| 5,257,225 A | * | 10/1993 | Lee | 365/185.19 |
| 5,537,108 A | * | 7/1996 | Nathan et al. | 257/529 |
| 5,600,575 A | * | 2/1997 | Anticole | 702/132 |
| 6,624,499 B2 | | 9/2003 | Kothandaraman et al. | |
| 2003/0122200 A1 | * | 7/2003 | Kamiya et al. | 257/379 |
| 2005/0189613 A1 | | 9/2005 | Otsuka et al. | |
| 2005/0237841 A1 | | 10/2005 | Wu et al. | |
| 2005/0286332 A1 | | 12/2005 | Uvieghara | |
| 2006/0044049 A1 | | 3/2006 | Ouellette et al. | |
| 2006/0087001 A1 | | 4/2006 | Kothandaraman et al. | |
| 2006/0108662 A1 | | 5/2006 | Kothandaraman et al. | |

OTHER PUBLICATIONS

J.R. Lloyd, "Electromigration for Designers: An Introduction for Non-Specialist", http://www.techonline.com/community/ed_resource/feature_article/20421, 10 pages.

* cited by examiner

*Primary Examiner* — Robert Huber
(74) *Attorney, Agent, or Firm* — Catherine Ivers

(57) ABSTRACT

An apparatus and method for programming an electronically programmable semiconductor fuse applies a programming current to a fuse link as a series of multiple pulses. Application of the programming current as a series of multiple short pulses provides a level of programming current sufficiently high to ensure reliable and effective electromigration while avoiding exceeding temperature limits of the fuse link.

17 Claims, 4 Drawing Sheets

APPARATUS AND METHOD FOR PROGRAMMING AN ELECTRONICALLY PROGRAMMABLE SEMICONDUCTOR FUSE

CROSS REFERENCE TO RELATED APPLICATIONS

A non-provisional patent application entitled "Method for Programming an Electronically Programmable Semiconductor Fuse", U.S. application Ser. No. 11/548,447, assigned to the same assignee as the present application and directed to generally related subject matter, is being submitted to the U.S. Patent and Trademark Office on the same day as the present application.

BACKGROUND OF THE INVENTION

The invention relates generally to electronically programmable semiconductor fuses, and more particularly to an apparatus and method of programming an electronically programmable semiconductor fuse.

Programmable semiconductor fuse devices are known in the art. For example, with reference to FIGS. 1-5, and initially to FIGS. 1 and 2, U.S. Patent Application Publication Nos. 2006/0087001 (Kothandaraman et al., the "'001 reference") and 2006/0108662 (Kothandaraman et al., the "'662 reference"), both of which are assigned to the same assignee as the present application, disclose an electronically programmable semiconductor fuse assembly (or "eFuse") 10 including a first conductive area 12 and a second conductive area 14 coupled by a fuse link 16. The '001 reference and the '662 reference are incorporated herein by reference in their entirety. The first and second conductive areas 12 and 14, as well as the fuse link 16 are formed from a polysilicon layer 24 and a metallic silicide layer 26 deposited over an insulating layer 22. As discussed in the '001 reference, the polysilicon layer 24 preferably includes a dopant. The insulating layer 22 may be formed, for example, from silicon oxide. The insulating, polysilicon, and silicide layers 22, 24, and 26, respectively, are formed on a semiconductor substrate 20. A capping barrier layer (not shown) formed, for example, from silicon nitride, may be provided over the insulating, polysilicon, and metallic silicide layers 22, 24, 26, respectively. The first and second conductive areas 12 and 14 are provided with contacts 18. The contacts are preferably formed from a metal such as tungsten.

An eFuse 10 programmed by an electromigration process changes from having a first resistance in an unprogrammed state to a second resistance, significantly higher than the first resistance, in a programmed state. To program the eFuse 10, a potential is applied across the fuse link 16 generating a programming current and raising the temperature of the fuse link 16. The electromigration process is affected by both the resultant current density within the fuse link 16, as well as by the temperature generated as a result of Joule heating generated by the current flow within the fuse link 16. With application of sufficient programming current, electromigration of metal within the silicide layer 26 occurs, with migration of the metal toward the anodic conductive area. Also, the dopant in the polysilicon layer 24 migrates toward the anodic conductive area. With migration of metal in the silicide layer 26 and of dopant in the polysilicon layer 24, the resistance of the fuse link 16 increases.

Programming an eFuse 10 requires providing a programming current of sufficient magnitude to reliably cause the desired degree of electromigration within the fuse link 16. However, exceeding the desired level of programming current can lead to excessive fuse link temperatures $T_{FL}$. Specifically, the fuse link 16 has a rupture temperature $T_R$ at which the fuse link 16 is physically ruptured. Such rupture (uncontrolled explosion) of the fuse link 16 is undesirable as it can damage both the fuse link 16 as well as surrounding portions of the semiconductor device, rendering the eFuse 10 unsuitable for use. There is thus a relatively narrow range within which the programming current is both sufficiently large to cause an effective level of electromigration and sufficiently small to avoid heating the fuse link 16 beyond the rupture temperature $T_R$.

The artisan will appreciate that variations inherent in the semiconductor manufacturing process can affect the range of acceptable programming current. For example, variations in the geometry or material composition of the fuse link 16 can decrease the range of acceptable programming current.

With reference now to FIG. 3, it is known to control the programming process of the programmable fuse 10 using a prior art current supply 40 comprising a programming field effect transistor (FET) 30 operatively coupled to control circuitry 32. The control circuitry 32 may include, for example, a pulse generator, one or more logic gates, or other conventional electrical components. The control circuitry is used to generate a pulse of voltage Vgs delivered to the gate of the programming FET 30. The eFuse 10 designer selects set points for programming FET gate voltage Vgs and programming voltage $V_{FS}$ corresponding to a programming current within the desired range of programming currents. For example, it is known in the art to generate a voltage pulse Vgs, typically having a magnitude in the range of 1.5 to 3.3 V, for a duration typically in the range of 5 to 250 microseconds, while simultaneously applying a programming voltage $V_{FS}$, typically in the range of 1.0 to 3.5 V. With reference to FIG. 4, in one example of a prior art current supply 40, assuming application of a programming FET gate voltage Vgs of 2.0 V, in combination with a programming voltage $V_{FS}$ of 2.0 V, a programming current of roughly 15 mA is generated.

With continued reference to FIG. 4, it is noted that operation of the programming FET 30 in the transistor's saturation region, rather than in the linear region, is desirable, as in the saturation region, the programming current is relatively stable and insensitive to variations in the programming voltage. In the linear region, the programming current is substantially more sensitive to variation in the programming voltage. As discussed above, given that it is necessary to control the programming current within a specific range, additional variability in the programming current resulting from operating in the linear region is undesirable.

With reference to FIG. 5, the set points chosen for Vgs and $V_{FS}$ result in a theoretically satisfactory programming current (that is, a programming current sufficient to generate the desired degree of electromigration, without inducing a temperature in the fuse link 16 which exceeds the rupture temperature $T_R$). However, given variability in the characteristics of the eFuse 10 device (including both the current supply 40 and the fuse link 16 itself), it is difficult to obtain a one hundred percent yield in the programming process. That is, some eFuse 10 devices programmed in the conventional manner will have either incomplete electromigration or will rupture due to excessive temperature.

A need exists, therefore, for an apparatus and method of programming an electronically programmable fuse which allows the eFuse 10 to be reliably programmed while also avoiding application of excessive programming current and the consequent potential for exceeding the rupture temperature of the fuse link 16.

BRIEF SUMMARY OF THE INVENTION

Briefly stated, in a first aspect the invention is a method of programming an electronically programmable semiconductor fuse. The method comprises a step of providing a semiconductor fuse structure including a first conductive area and a second conductive area coupled by a fuse link. A current supply operatively coupled to the semiconductor fuse is provided, wherein the current supply is capable of supplying more current to the semiconductor fuse than is required to initiate electromigration in the fuse link. A programming current from the current supply to the semiconductor fuse is applied as series of multiple pulses, each pulse having a pulse duration, a cycle duration, an amplitude, and a duty cycle. Programming of the semiconductor fuse is completed upon application of the programming current through the series of multiple pulses.

In a second aspect, the invention is an apparatus for programming a semiconductor fuse structure including a first conductive area and a second conductive area coupled by a fuse link. The apparatus comprises a current supply including circuitry operatively coupled to the semiconductor fuse to deliver a cyclic programming current as a series of pulses. Each pulse has an amplitude and a cycle duration. Programming of the semiconductor fuse is completed upon application of the programming current through the series of multiple pulses. The cycle duration is between about 0.01 and about 0.17 times a thermal time constant of the fuse link.

In a third aspect, the invention is an apparatus for programming a semiconductor fuse structure including a first conductive area and a second conductive area coupled by a fuse link. The apparatus comprises a current supply including a programmable pulse generator operatively coupled to the semiconductor fuse and programmed to deliver a cyclic programming current as a series of pulses, each pulse having an amplitude and a cycle duration. Programming of the semiconductor fuse is completed upon application of the programming current through the series of multiple pulses. Continuous application of a constant programming current having an amplitude equal to an average of the maximum amplitudes of the series of pulses for a time period equal to a sum of the cycle durations of each of the series of pulses would cause heating of the fuse link to a temperature exceeding a rupture temperature of the fuse link.

BRIEF DESCRIPTION OF THE SEVERAL VIEWS OF THE DRAWINGS

The following detailed description of preferred embodiments of the invention will be better understood when read in conjunction with the appended drawings. For the purpose of illustrating the invention, there is shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
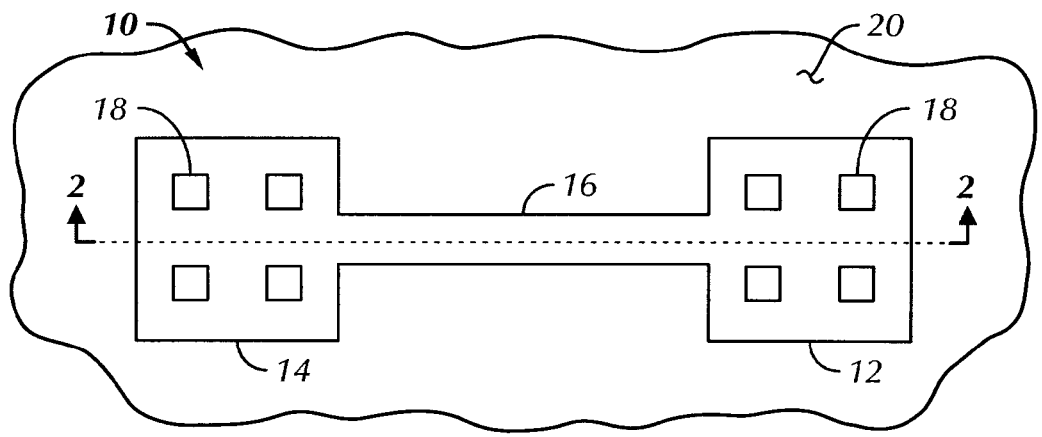
FIG. 1 is a top plan view of an electronically programmable semiconductor fuse device know in the prior art.
Figure 2:
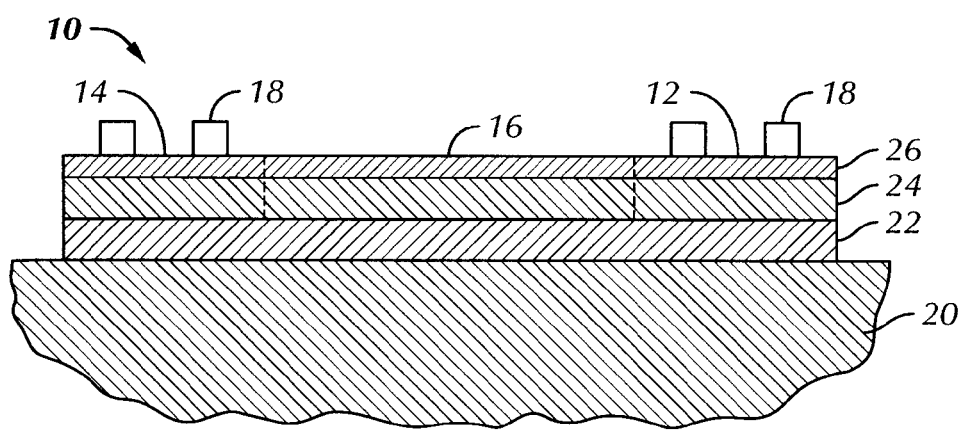
FIG. 2 is a cross-sectional view of the fuse device of FIG. 1, taken along line 2-2 of FIG. 1.
Figure 3:
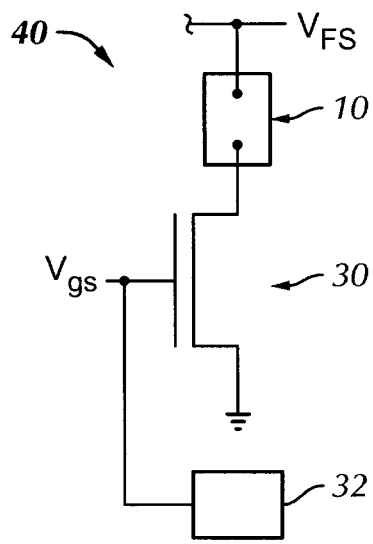
FIG. 3 is a schematic diagram of a known apparatus used to program the fuse device of FIG. 1.

As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

Referring to FIGS. 6-9, there are shown preferred embodiments of a current supply apparatus, generally designated 50, and a method, generally designated 100, in accordance with the present invention.

Figure 7:
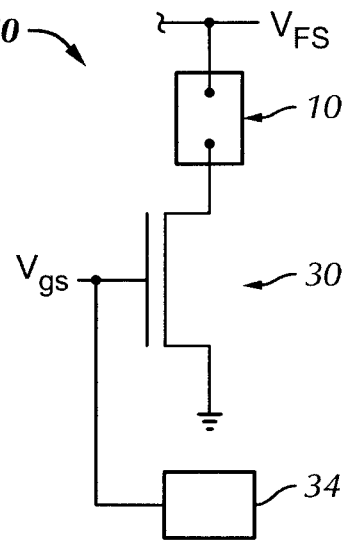
FIG. 7 is a schematic diagram of an apparatus in accordance with the present invention for practicing the method of FIG. 6.
Figure 6:
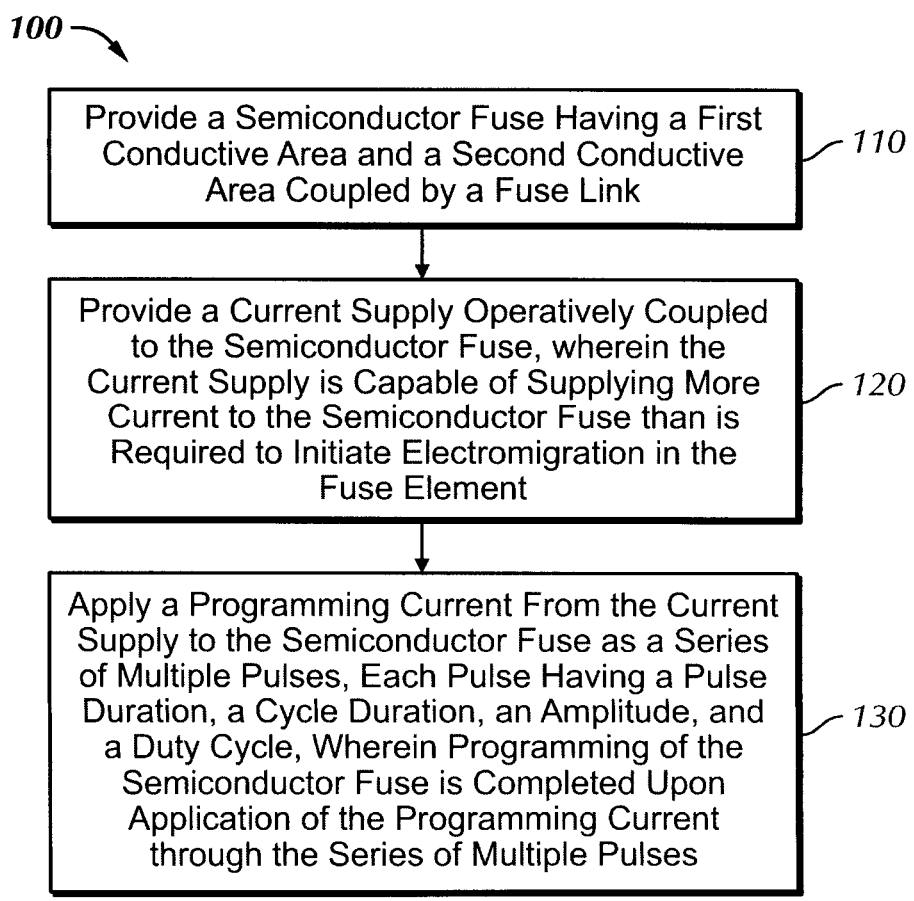
FIG. 6 is a diagram of steps of a method of programming the fuse device of FIG. 1 in accordance with the present invention.
Figure 4:
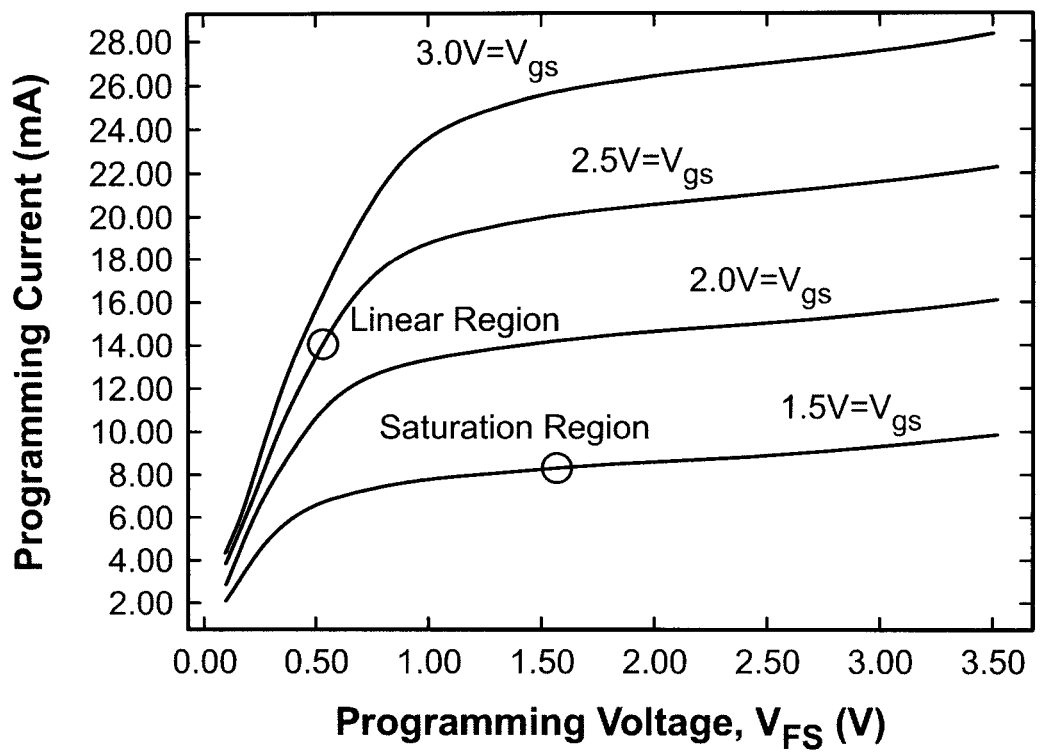
FIG. 4 is a graphical representation of variation of a programming current with a gate voltage and a programming voltage applied to a field effect transistor component of the known apparatus of FIG. 3.
Figure 5:
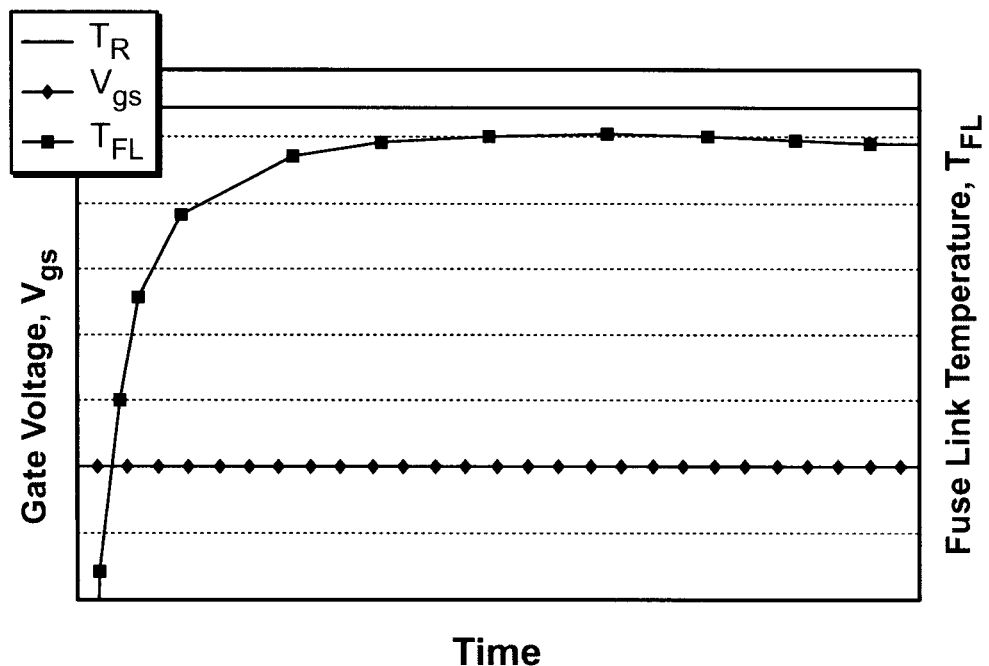
FIG. 5 is a graphical representation of variation of gate voltage in the known apparatus of FIG. 3 and a fuse link temperature in the fuse device of FIG. 1 with time.
Figure 8:
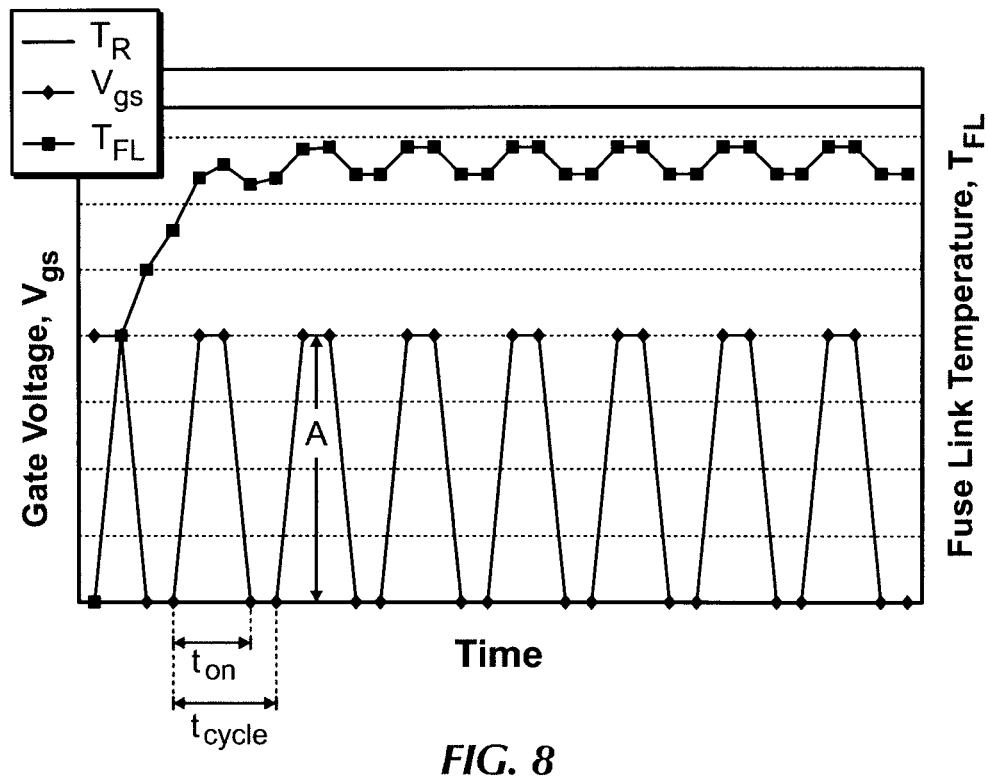
FIG. 8 is a graphical representation of variation of gate voltage generated by the apparatus of FIG. 7 and resulting fuse link temperature in the fuse device of FIG. 1 with time.

With particular reference to FIGS. 6-8, the method 100 of programming the electronically programmable semiconductor fuse or eFuse 10 comprises a step 110 of providing a semiconductor fuse structure including first conductive area 12 and second conductive area 14 coupled by fuse link 16. In a step 120, a current supply 50 operatively coupled to the semiconductor fuse 10 is provided, wherein the current supply 50 is capable of supplying more current to the semiconductor fuse than is required to initiate electromigration in the fuse link. In a step 130, a programming current from the current supply 50 is applied to the semiconductor fuse 10 as series of multiple pulses, each pulse having a pulse duration $t_{on}$, a cycle duration $t_{cycle}$, an amplitude A, and a duty cycle. The duty cycle is defined as the ratio of the pulse duration to the cycle duration (or period of the cycle). The programming of the semiconductor fuse 10 is completed only upon application of the programming current through the series of multiple pulses.

With particular reference now to FIG. 7, the current supply 50 used in conjunction with the programming method 100 includes circuitry 34 (for example, a programmable pulse generator or other circuitry capable of producing gate voltage Vgs as a series of pulses) operatively coupled to the fuse device 10 to deliver the series of multiple pulses. The programming FET 30 used in the current supply 50 is conventional, and operates in the manner discussed above relative to the programming FET 30 of the prior art current supply 40.

The current supply 50 is capable of supplying at least 120 percent of the current required to initiate electromigration in the fuse link 16. If the current supply were capable of producing only 100 percent of the current required to initiate electromigration, use of the method 100 would result in underprogramming. With a current supply capable of supplying between 100 and 120 percent of the current required to initiate electromigration, the duty cycle would be limited to a value greater than 83 percent, providing very little benefit over prior art techniques.

Preferably, in the step 130 of applying the programming current, the programming voltage $V_{FS}$ and the gate voltage Vgs applied to the programming FET 30 are selected to maintain operation of the FET 30 in a saturation operating region of the programming FET 30.

With particular reference now to FIG. 8, the duty cycles of the series of multiple pulses may either be substantially equal as illustrated, or may vary from one pulse cycle to the next. The duty cycle of an initial pulse may be less than that of a final pulse, or vice versa. Similarly, the pulse duration $t_{on}$, cycle duration $t_{cycle}$ (or period), and/or pulse amplitude A of each of the multiple pulses may be substantially equal, or may vary from one cycle to the next. For example, the pulse duration, cycle duration and/or pulse amplitude of an initial pulse may be less than that of a final pulse, or vice versa.

Figure 9:
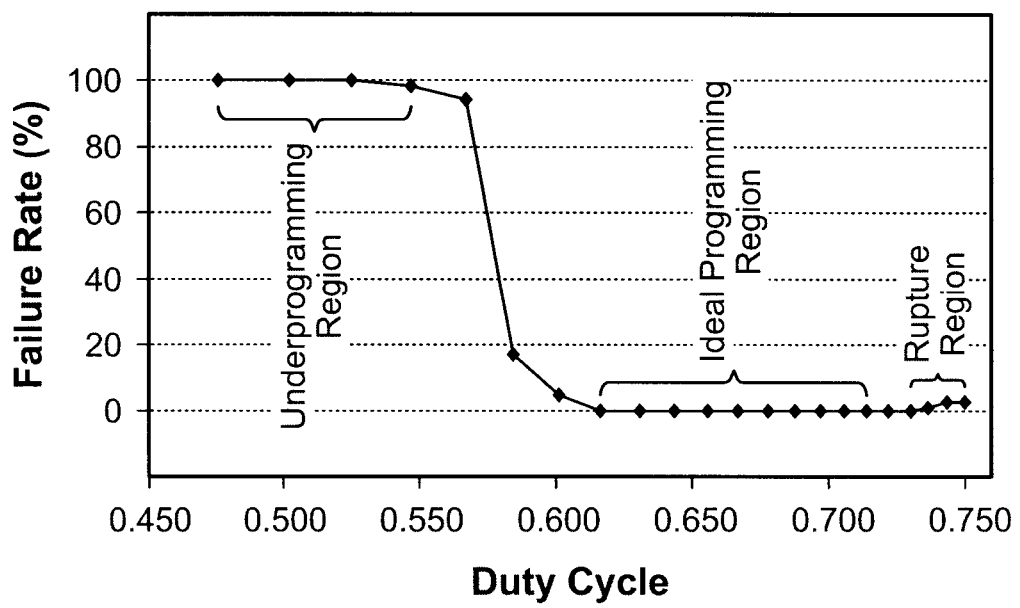
FIG. 9 is a graphical representation of variation of failure rate as a function of a duty cycle of the method of FIG. 6.

With reference now to FIG. 9, preferably, the duty cycle, whether constant or variable from one pulse cycle to the next, is within the range of 0.62 to 0.69. FIG. 9 plots an eFuse programming failure rate as a function of duty cycle. In the illustrated application, the programming voltage $V_{FS}$ was 2.9V, the gate voltage Vgs was 2.6V, for operation of the programming FET 30 in saturation. 350 pulses were employed. The duty cycle was varied by varying the pulse duration (from 9 to 30 nano-seconds) and the cycle duration (from 19 to 40 nanoseconds). The pulse off time was held constant at 10 nanoseconds. For a duty cycle less than approximately 0.55, the failure rate is 100 percent, as the programming current was insufficient to cause electromigration. For a duty cycle between 0.62 and 0.69, the failure rate dropped to zero percent, as within this range the programming current was both sufficient to cause electromigration while also insufficient to cause the fuse link 16 to heat to the rupture temperature $T_R$. For a duty cycle greater than approximately 0.70, the failure rate increased above 0 percent, due to excessive heating of the fuse link 16.

Preferably, the amplitude of each programming current pulse is in the range of about four to about ten milliamps. The cycle duration $t_{cycle}$ (or, alternatively, corresponding frequency) of the programming current pulse is preferably in the range of 5 to 100 nanoseconds. A thermal time constant of a preferred embodiment of the fuse link 16 (that is, the time required for the fuse link 16 to reach 63.2% of it's final temperature when subjected to a step input (such as a programming current) causing a change in temperature) was experimentally determined to be in the range of about 600 to 700 nanoseconds. Thus, the preferred range of cycle durations corresponds to about 0.01 and 0.17 times a thermal time constant. Most preferably, the cycle duration is less than about 30 nanoseconds, corresponding to about 0.05 times the thermal time constant of the fuse link 16, or less.

The artisan will note that the experimentally determined preferred 30 nanosecond limit is influenced not only by the thermal characteristics of the fuse link 16, but also by parasitic capacitances and inductances in other elements of the current supply 50.

The benefit of a cycle duration which is substantially less than the fuse link thermal time constant results from the fact that the electroprogramming process is aided by higher temperatures. With a relatively short cycle duration (relative to the fuse link thermal time constant), the fuse link temperature does not decay significantly between pulses.

The programming method 100 and associated current supply 50 provide the benefits of a relatively high programming current and a relatively constant fuse link temperature (both of which result in reliable initiation of the electromigration process), while mitigating the potential for overheating the fuse link 16. As suggested by the data of FIG. 9, if the programming current were applied continuously for a period of time equal to a sum of the cycle durations of each of the series of pulses, at an amplitude equal to an average of the maximum amplitudes of the series of pulses, the fuse link temperature $T_{FL}$ would reach a level exceeding the rupture temperature $T_R$.

From the foregoing it can be seen that the present invention provides an apparatus and method for programming an electronically programmable fuse providing a high level of programming current necessary to reliably and effectively cause electromigration while also avoiding excessive temperature in the fuse link.

It will be appreciated by those skilled in the art that changes could be made to the embodiments described above without departing from the broad inventive concept thereof. It is to be understood, therefore, that this invention is not limited to the particular embodiments disclosed, but it is intended to cover modifications within the spirit and scope of the present invention as defined by the appended claims.

That which is claimed is:

1. A method of programming an electronically programmable semiconductor fuse, comprising steps of:
   providing a semiconductor fuse structure including a first conductive area and a second conductive area coupled by a fuse link wherein the fuse link comprises a semiconductor material;
   providing a current supply operatively coupled to the semiconductor fuse; and
   applying a programming current from the current supply to the semiconductor fuse as series of multiple pulses, each pulse having a pulse duration, a cycle duration, an amplitude, and a duty cycle, wherein the current supply supplies current at an amplitude to the semiconductor fuse greater than 120 percent of the current required to initiate electromigration in the fuse link when applied;
   wherein programming of the semiconductor fuse is completed upon application of the programming current through the series of multiple pulses.

2. The method of programming an electronically programmable semiconductor fuse of claim 1, wherein the current supply includes a programming FET and the step of applying the programming current includes applying a programming voltage and a gate voltage to the programming FET, wherein the programming voltage and gate voltage are selected to maintain operation of the FET in a saturation operating region of the programming FET.

3. The method of programming an electronically programmable semiconductor fuse of claim 1, wherein the duty cycle of each pulse is substantially equal.

4. The method of programming an electronically programmable semiconductor fuse of claim 1, wherein the cycle duration of each pulse is substantially equal.

5. The method of programming an electronically programmable semiconductor fuse of claim 1, wherein the amplitude of each of the multiple pulses is substantially equal.

6. The method of programming an electronically programmable semiconductor fuse of claim 1, wherein the duty cycle of each pulse is in the range of 0.62 to 0.69.

7. The method of programming an electronically programmable semiconductor fuse of claim 1, wherein the duty cycle of an initial pulse is different from the duty cycle of a final pulse.

8. The method of programming an electronically programmable semiconductor fuse of claim 7, wherein the duty cycle of the initial pulse is less than the duty cycle of the final pulse.

9. The method of programming an electronically programmable semiconductor fuse of claim 7, wherein the duty cycle of the initial pulse is greater than the duty cycle of the final pulse.

10. The method of programming an electronically programmable semiconductor fuse of claim 1, wherein the amplitude of an initial pulse is different from the amplitude of a final pulse.

11. The method of programming an electronically programmable semiconductor fuse of claim 9, wherein the amplitude of the initial pulse is less than the amplitude of the final pulse.

12. The method of programming an electronically programmable semiconductor fuse of claim 1, wherein the amplitude of each programming current pulse is in the range of about four to about ten milliamps.

13. The method of programming an electronically programmable semiconductor fuse of claim 1, wherein the cycle duration is about five nanoseconds to about one hundred nanoseconds.

14. The method of programming an electronically programmable semiconductor fuse of claim 1, wherein the cycle time is less than 30 nanoseconds.

15. The method of programming an electronically programmable semiconductor fuse of claim 1, wherein, the cycle duration is between about 0.01 and about 0.17 times a thermal time constant of the fuse link.

16. A method of programming an electronically programmable semiconductor fuse, comprising steps of:
    providing a semiconductor fuse structure including a first conductive area and a second conductive area coupled by a fuse link;
    providing a current supply operatively coupled to the semiconductor fuse; and
    applying a programming current from the current supply to the semiconductor fuse as series of multiple pulses, each pulse having a pulse duration, a cycle duration, an amplitude, and a duty cycle, wherein the current supply supplies current at an amplitude to the semiconductor fuse greater than 120 percent of the current required to initiate electromigration in the fuse link when applied;
    wherein programming of the semiconductor fuse is completed upon application of the programming current through the series of multiple pulses,
    wherein during programming, a fuse link temperature does not exceed a rupture temperature, and
    wherein the duty cycle of each pulse is in the range of 0.62 to 0.69.

17. A method of programming an electronically programmable semiconductor fuse, comprising steps of:
    providing a semiconductor fuse structure including a first conductive area and a second conductive area coupled by a fuse link;
    providing a current supply operatively coupled to the semiconductor fuse; and
    applying a programming current from the current supply to the semiconductor fuse as series of multiple pulses, each pulse having a pulse duration, a cycle duration, an amplitude, and a duty cycle;
    wherein programming of the semiconductor fuse is completed upon application of the programming current through the series of multiple pulses, and
    wherein the duty cycle of each pulse is in the range of 0.62 to 0.69.

* * * * *